US006459110B1

(12) United States Patent
Tani

(10) Patent No.: US 6,459,110 B1
(45) Date of Patent: Oct. 1, 2002

(54) SEMICONDUCTOR STORAGE ELEMENT

(75) Inventor: Kouichi Tani, Tokyo (JP)

(73) Assignee: Oki Electric Industry, Co., Ltd. (JP)

( * ) Notice: Subject to any disclaimer, the term of this patent is extended or adjusted under 35 U.S.C. 154(b) by 0 days.

(21) Appl. No.: 09/589,401

(22) Filed: Jun. 8, 2000

(30) Foreign Application Priority Data

Jul. 30, 1999 (JP) ............................................. 11-217401

(51) Int. Cl.[7] ......................... H01L 29/76; G11C 11/22; G11C 11/34
(52) U.S. Cl. .......................... 257/295; 365/145; 365/65; 365/182; 365/184
(58) Field of Search ............................ 257/295; 365/65, 365/145, 182, 184

(56) References Cited

U.S. PATENT DOCUMENTS

| | | | | |
|---|---|---|---|---|
| 3,702,466 A | * | 11/1972 | Nakagiri et al. | 340/173 |
| 5,530,668 A | * | 6/1996 | Chern et al. | 365/145 |
| 5,680,344 A | * | 10/1997 | Seyyedy | 365/145 |
| 5,689,456 A | * | 11/1997 | Kobayashi | 365/145 |
| 5,723,855 A | * | 3/1998 | Ooishi | 257/295 |
| 5,768,176 A | * | 6/1998 | Katoh | 365/145 |
| 5,774,392 A | * | 6/1998 | Kraus et al. | 365/145 |
| 6,198,652 B1 | * | 3/2001 | Kawakubo et al. | 365/145 |

OTHER PUBLICATIONS

T. Nakamura, "Study of Ferroelectric Thin Films for Application to NDRO Nonvolatile Memories", Technical Report of IEICE SDM93–136, 1993, pp. 53–59 (The Institute of Electronics Information and Communication Engineers).

* cited by examiner

Primary Examiner—Eddie Lee
Assistant Examiner—Joseph Nguyen
(74) Attorney, Agent, or Firm—Venable; James R. Burdett

(57) ABSTRACT

A memory cell array, in which a voltage that can reverse polarization is applied only to a memory cell that is an object of data writing. A semiconductor storage element is formed by a ferroelectric capacitor, a selection transistor and a control transistor. The ferroelectric capacitor is structured to be provided with a ferroelectric layer between an upper electrode and a lower electrode. The selection transistor is provided with a first main electrode, a second main electrode and a control electrode. The control transistor is provided with a first main electrode, a second main electrode and a control electrode. The lower electrode of the ferroelectric capacitor is connected with the first main electrode of the selection transistor. The second main electrode of the selection transistor is connected with the control electrode of the control transistor.

10 Claims, 5 Drawing Sheets

SEMICONDUCTOR STORAGE ELEMENT

BACKGROUND OF THE INVENTION

1. Field of the Invention

This invention relates to a semiconductor storage element provided with a ferroelectric capacitor.

2. Description of the Related Art

Ferroelectrics exhibit spontaneous polarization, which reverses direction in response to an applied field. There are two principal types of semiconductor storage element that make use of this spontaneous polarization. The first type is called the one-transistor type, and the second type is called the one-transistor-one-capacitor type. Recently, as non-destructive data reading and high-level integration have become possible, there has been demand for implementation of the one-transistor type.

Examples of one-transistor type semiconductor storage elements are presented in documents such as *Technical Report of IEICE SDM*93-136, pp. 53–59. According to the MFMIS structure (Metal/Ferroelectric/Metal/Insulator/Semiconductor) presented in that document, an insulating layer, a lower electrode, a ferroelectric layer and an upper electrode are sequentially laid on a semiconductor substrate. The reason for this structure is that ferroelectric layers do not grow well on semiconductors and insulating layers. In the MFMIS structure, it is sufficient that the ferroelectric layer is formed above the conductive material (i.e., metal) layer. Thus, layer formation is easy.

Further, when a voltage is applied to the ferroelectric layer, charge is accumulated at the ferroelectric layer by remanence of the ferroelectric layer. Specifically, when a positive voltage is applied to the ferroelectric layer, a positive charge is accumulated, and when a negative voltage is applied to the ferroelectric layer, a negative charge is accumulated. In an MFMIS structure semiconductor storage element, the accumulated charge excites a charge at the top surface of the substrate. Hence, even when the applied voltage is 0V, a switching state of a transistor, which is one of an ON state and an OFF state, is selectively preserved. In this way, data can be written at the ferroelectric layer. Moreover, current between a source electrode and a drain electrode changes in response to the switching state of the transistor. Thus, by detection of this change, data reading can be performed.

However, when data is written to a selected cell in a memory cell structure that uses conventional semiconductor storage elements, disturbance, which is alteration of data stored in other cells, may occur. An example is described with reference to FIG. 4, which is a circuit diagram showing the structure of a memory array using conventional semiconductor storage elements.

As shown in FIG. 4, the memory array is formed with a predetermined number of memory cells lined up horizontally and vertically. Each memory cell is an MFMIS structure combining a ferroelectric capacitor and a p-type control transistor. Namely, each memory cell has a structure wherein one electrode of the ferroelectric capacitor (the lower electrode) is connected with a gate electrode of the control transistor.

Further, a line Wn (the symbol n represents a row number of a specified memory cell) is connected at another electrode of the ferroelectric capacitor (the upper electrode). A line Bn is connected at the source electrode of the control transistor, and a line Dm (the symbol m represents a column number of the specified memory cell) is connected at a drain electrode of the control transistor. Further, the drain electrode of the control transistor is connected to the substrate.

Next, using a memory cell 100 in the memory array shown in FIG. 4 as an example, operation of the memory cells is explained. The upper electrode of the ferroelectric capacitor of the memory cell 100 is connected with line W2, and the drain electrode of the control transistor of the memory cell 100 is connected with line D2.

To record data at the memory cell 100, a voltage is applied to line W2. This voltage is set to be large enough to reverse the polarization of the ferroelectric capacitor. In this example, the voltage is set at 10V. Meanwhile, line D2 stays at 0V. When voltage is applied thus, data is written at the memory cell 100.

Further, when memory cell 100 is being written to, voltages of 5V are applied to lines Wn and Dm that are connected to other memory cells, in order to protect data. Hence, when data is written to memory cell 100 in this way, a 5V voltage difference occurs between the substrate and upper electrodes of ferroelectric capacitors of memory cells, besides memory cell 100, that are connected to one of lines D2 and W2. Consequently, data stored at these memory cells may be destroyed.

For example, at a memory cell 102, whose ferroelectric capacitor upper electrode is connected with line W3 and whose control transistor drain electrode is connected with line D2, a datum −Pr has been stored (the symbol Pr represents a remanence value).

FIG. 5 is a graph showing a hysteresis characteristic of a ferroelectric capacitor. The horizontal axis of the graph is applied voltage and the vertical axis is polarization charge. As shown by hysteresis curve a, when a voltage of about 5V (hereinafter called the reversal voltage) is applied to the ferroelectric capacitor, the ferroelectric remanence changes from −Pr to +Pr.

As described above, during operation of the memory cell array, a 5V voltage difference occurs at memory cell 102, between the ferroelectric capacitor upper electrode and the substrate. If the aforementioned reversal voltage is larger than 5V, the stored data state returns to the original value, −Pr, after the applied voltage is removed. However, because of variations in ferroelectric characteristics and voltage levels, the applied voltage may be larger than 5V or the reversal voltage may be smaller than 5V. In such cases, the datum may change from −Pr to +Pr and a data error may occur.

SUMMARY OF THE INVENTION

Therefore, realization of a semiconductor storage element in which a voltage capable of reversing polarization is applied only to a memory cell that is an object of data writing has been conventionally desired.

A first aspect of a semiconductor storage element of the present invention comprises: a ferroelectric capacitor; a selection transistor; and a control transistor. One electrode of the ferroelectric capacitor is connected with a first main electrode of the selection transistor, and a second main electrode of the selection transistor is connected with a control electrode of the control transistor.

A second aspect of a semiconductor storage element of the present invention comprises: a ferroelectric capacitor; a first transistor; and a second transistor. One electrode of two electrodes of the ferroelectric capacitor is connected with one electrode of two main electrodes of the first transistor, and another main electrode of the first transistor is connected with a control electrode of the second transistor.

In the semiconductor storage element of the second aspect, the first transistor may be a field effect transistor, with the two main electrodes of the first transistor being a source electrode and a drain electrode.

Also, in the semiconductor storage element of the second aspect, the second transistor may be a field effect transistor, with the control electrode of the second transistor being a gate electrode.

A third aspect of a semiconductor storage element of the present invention comprises: a ferroelectric capacitor structured to have a ferroelectric layer between an upper electrode and a lower electrode; a selection transistor having a first main electrode, a second main electrode and a control electrode; and a control transistor having a first main electrode, a second main electrode and a control electrode. The lower electrode of the ferroelectric capacitor is connected with the first main electrode of the selection transistor, and the second main electrode of the selection transistor is connected with the control electrode of the control transistor.

A memory cell array of the present invention comprises a memory cell including: a ferroelectric capacitor structured to have a ferroelectric layer between an upper electrode and a lower electrode; a selection transistor having a first main electrode, a second main electrode and a control electrode; and a control transistor having a first main electrode, a second main electrode, a control electrode and a back gate electrode. The lower electrode of the ferroelectric capacitor is connected with the first main electrode of the selection transistor, and the second main electrode of the selection transistor is connected with the control electrode of the control transistor. The memory cell array further comprises: a power supply; a selection transistor driving section; a sense amplifier; a data readout driving section; and an earth terminal. The upper electrode of the ferroelectric capacitor is connected with the power supply, the control electrode of the selection transistor is connected with the selection transistor driving section, the first main. electrode of the control transistor is connected with the sense amplifier, the second main electrode of the control transistor is connected with the data readout driving section, and the back gate electrode of the control transistor is connected with the earth terminal.

Hence, the semiconductor storage element is formed with a selection transistor connected between one electrode of a ferroelectric capacitor and a control electrode of a control transistor. By setting a switching state of this selection transistor, polarization of the ferroelectric capacitor can be reversed, and thus data can be written at the semiconductor storage element. Therefore, in a memory cell array having a structure that uses the semiconductor storage element of the present invention, reversal of polarization of any ferroelectric capacitor outside the cell being written to is not performed, and destruction of stored data does not occur.

DETAILED DESCRIPTION OF THE PREFERRED EMBODIMENT

An embodiment of the present invention is described below with reference to the Drawings. The Drawings show enough structure for understanding of the present invention, but size, layout and the like are shown only roughly. Moreover, conditions described below, such as values, materials and the like, are simply examples. Therefore, the present invention is not restricted in any way whatsoever by this embodiment.

Figure 1:
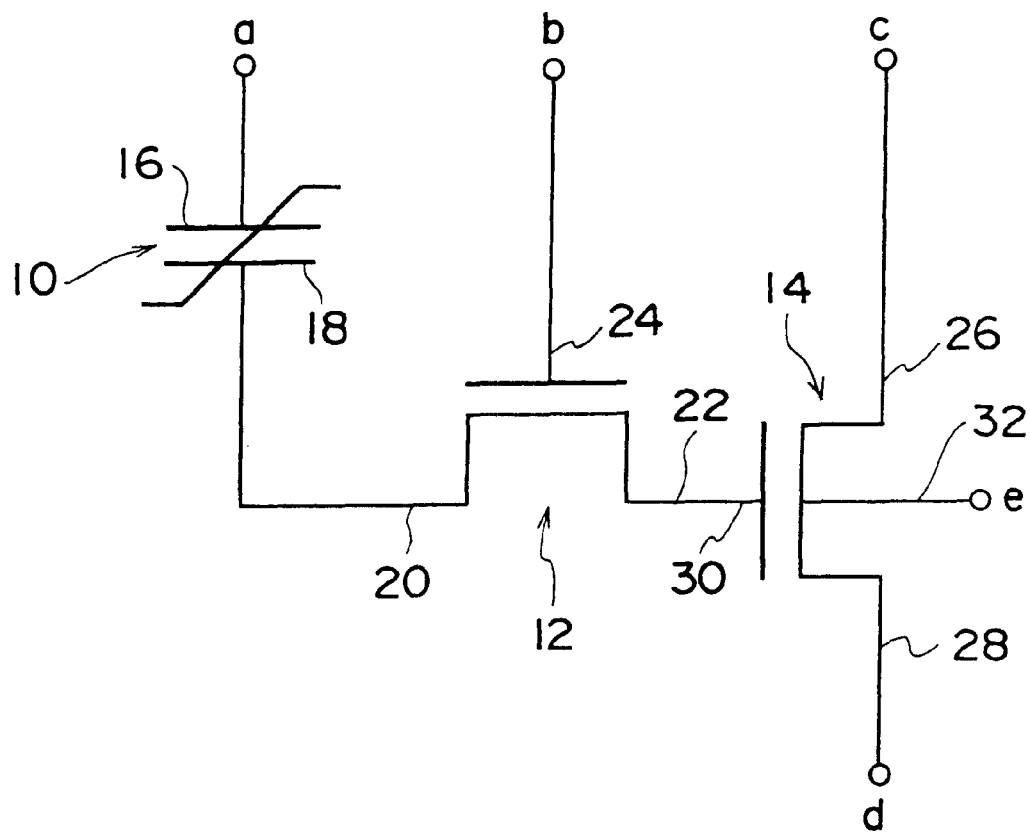
FIG. 1 is a view showing a structure of a semiconductor storage element embodiment.

First, structure of a semiconductor storage element of the embodiment is explained with reference to FIG. 1. FIG. 1 is a circuit diagram showing the structure of the semiconductor storage element of the embodiment.

The semiconductor storage element shown in FIG. 1 is formed by a ferroelectric capacitor 10, a selection transistor 12 and a control transistor 14. The ferroelectric capacitor 10 is formed with a ferroelectric layer between an upper electrode 16 (also called a control electrode) and a lower electrode 18. The selection transistor 12 has a first main electrode (source electrode or drain electrode) 20, a second main electrode (source electrode or drain electrode) 22 and a control electrode (gate electrode) 24. The control transistor 14 also has a first main electrode 26, a second main electrode 28 and a control electrode 30.

The lower electrode 18 of the ferroelectric capacitor 10 is connected with the first main electrode 20 of the selection transistor 12. The second main electrode 22 of the selection transistor 12 is connected with the control electrode 30 of the control transistor 14.

In addition, the semiconductor storage element shown in FIG. 1 has a terminal a, a terminal b, a terminal c, a terminal d and a terminal e. The upper electrode 16 of the ferroelectric capacitor 10 is connected with terminal a. The control electrode 24 of the selection transistor 12 is connected with terminal b. The first main electrode 26 of the control transistor 14 is connected with terminal c. The second main electrode 28 of the control transistor 14 is connected with terminal d. A back gate 32 of the control transistor 14 is connected with terminal e.

Figure 2:
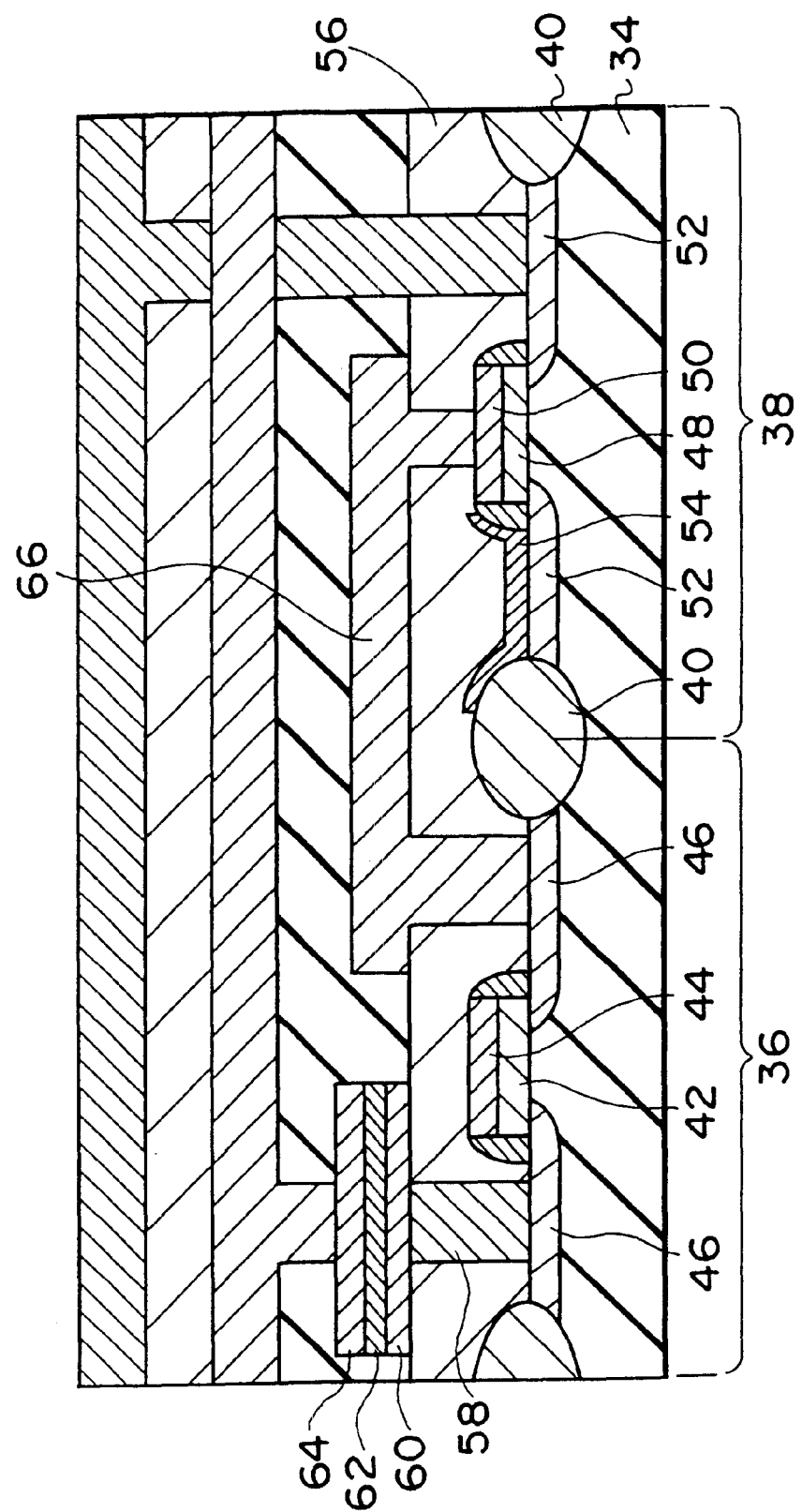
FIG. 2 is a view showing a sectional structure of a semiconductor storage element.

FIG. 2 is a sectional view showing a sectional structure of the semiconductor storage element relating to the present embodiment. The semiconductor storage element is formed on a silicon substrate 34. An area of the silicon substrate 34 shown in FIG. 2 is partitioned into two areas by an element division insulator 40. At a first area 36 of the silicon substrate 34, a selection transistor is formed. At a second area 38 of the silicon substrate 34, a control transistor is formed. A ferroelectric capacitor is formed through an inter-layer insulating layer 56, above the selection transistor.

First, structure of the selection transistor is explained. A gate oxidation layer 42 is formed at a surface of the silicon substrate 34 in the first area 36. A gate electrode 44 (corresponding to the control electrode 24 in FIG. 1) is formed at a top surface of the gate oxidation layer 42. Insulative side walls are formed in a state of contacting side surfaces of the gate structure. At top surface portions of the silicon substrate 34 excluding the gate structure, high conductivity areas are formed to serve as a source electrode and drain electrode 46 (corresponding to the first main electrode 20 and second main electrode 22 in FIG. 1).

Next, structure of the control transistor is explained. A gate oxidation layer 48 is formed at a surface of the silicon substrate 34 in the second area 38. A gate electrode 50 (corresponding to the control electrode 30 in FIG. 1) is formed at a top surface of the gate oxidation layer 48. Insulative side walls are formed in a state of contacting side surfaces of the gate structure. At top surface portions of the silicon substrate 34 excluding the gate structure, high conductivity areas are formed to serve as a source electrode and drain electrode 52 (corresponding to the first main electrode 26 and second main electrode 28 in FIG. 1). A connector 54 is provided above one of the source electrode and drain electrode 52 in a state of contacting thereat, so that a voltage, which is required when reading stored data, can be applied.

The inter-layer insulating layer 56 is deposited above the above-described selection transistor and control transistor. Contact holes are formed at the inter-layer insulating layer 56, at positions above each electrode, in order to implement connection between a layer top and a layer bottom. For example, a contact hole is formed above one of the source electrode and drain electrode 46 that form the selection transistor. Polycrystalline silicon is plugged into this hole to form a plug 58. A lower electrode 60 of the ferroelectric capacitor (corresponding to the lower electrode 18 in FIG. 1) is provided at a top surface of the inter-layer insulating layer 56, in a state of contacting a top surface of the plug 58. Further, a ferroelectric layer 62 is laminated at a top surface of the lower electrode 60, and an upper electrode 64 (corresponding to the upper electrode 16 in FIG. 1) is laminated at a top surface of the ferroelectric layer 62.

Hence, the ferroelectric capacitor is formed as a laminated structure of the lower electrode 60, the ferroelectric layer 62 and the upper electrode 64. The lower electrode 60 may be, for example, polycrystalline silicon, iridium and iridium oxide, sequentially laminated. The ferroelectric layer 62 may be, for example, a bismuth titanate layer (a BiT layer). The upper electrode 64 may be, for example, an iridium dioxide layer.

Another one of the source electrode and drain electrode 46 that form the selection transistor is connected with the gate electrode 50 of the control transistor by plugs and wiring 66. Also, an insulating layer and wiring are deposited over the above-described structure, forming a memory cell array. This kind of memory array can be formed by ordinary semiconductor processes.

Next, a data discrimination method for the memory cell (a method for discriminating '1' and '0') will be explained. First, a predetermined voltage is applied at the gate electrode 44 of the selection transistor 12, putting the selection transistor 12 into a low resistance state; i.e., an ON state. Consequently, there is a conductive path between the lower electrode 60 of the ferroelectric capacitor 10 and the gate electrode 50 of the control transistor 14. Thus, charge at the surface of the silicon substrate 34 is excited by charge accumulated in the ferroelectric layer 62. Therefore, a switching state of the control transistor 14 can be controlled by charge accumulated at the ferroelectric capacitor 10. For example, in a case wherein the silicon substrate 34 is a p-type semiconductor, if the ferroelectric layer 62 is charged with negative charge, the control transistor 14 will turn on. On the other hand, if the ferroelectric layer 62 is charged with positive charge, the control transistor 14 will turn off. Consequently, data reading can be performed by detecting the size of a current flowing between the source electrode and drain electrode of the control transistor 14.

Further, operation of the memory cell is explained with reference to FIG. 1. Herein, the control transistor 14 is considered to be a p-type transistor. A writing method is such that a writing terminal b is set at a high level and the selection transistor 12 turns on. Next, a voltage large enough to reverse the polarization of the ferroelectric capacitor 10 is applied at terminal a. At this time, terminal e is in a 0V state. Consequently, charge is accumulated at the ferroelectric capacitor 10.

A reading method is such that, first, terminal b is set at a high level and the selection transistor 12 turns on. Terminal a is put in a 0V state and terminal d is set at a high level. At this time, data can be read by detection of current flowing at terminal c.

Figure 3:
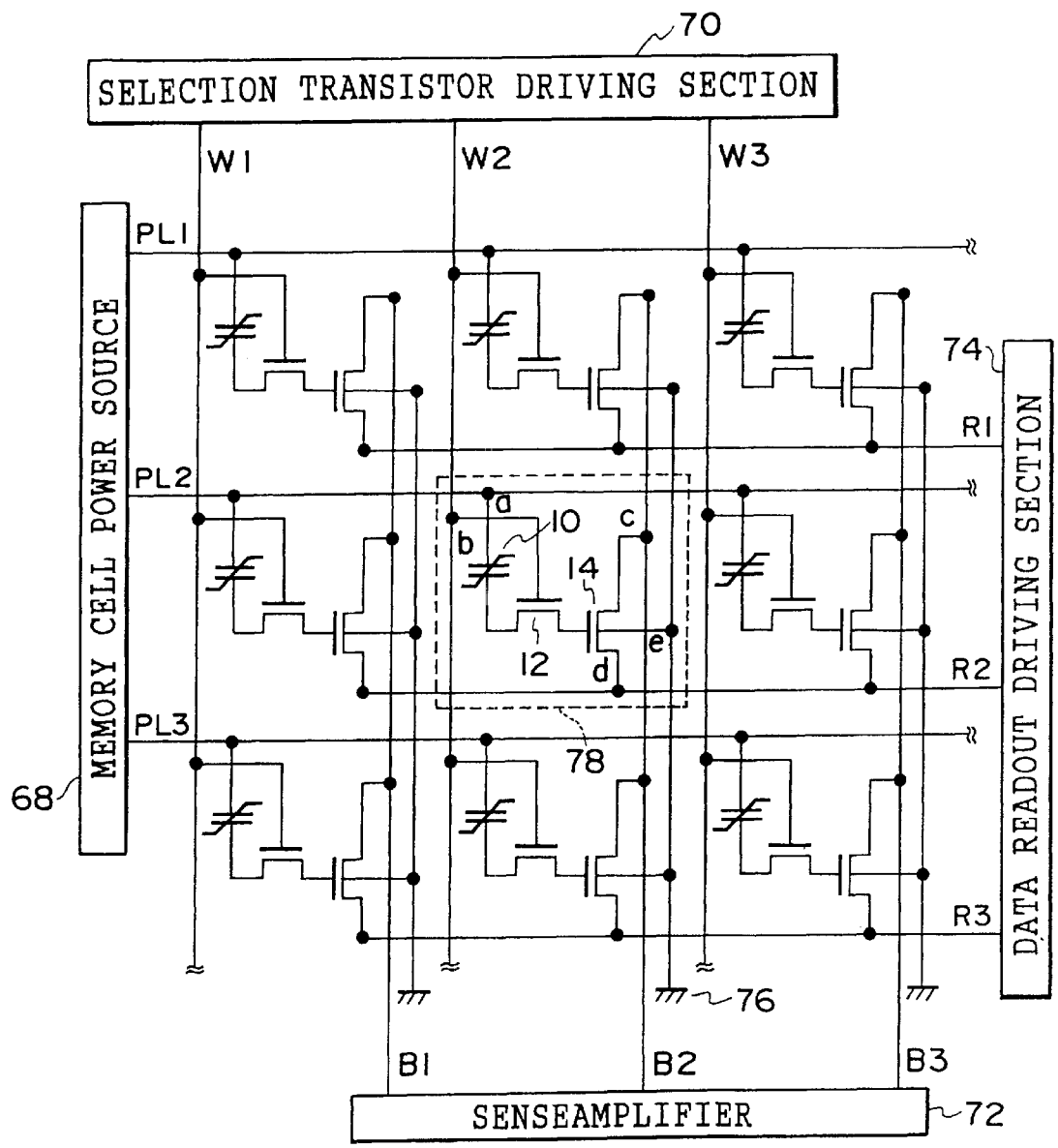
FIG. 3 is a view showing a structure of a memory cell array embodiment.
Figure 4:
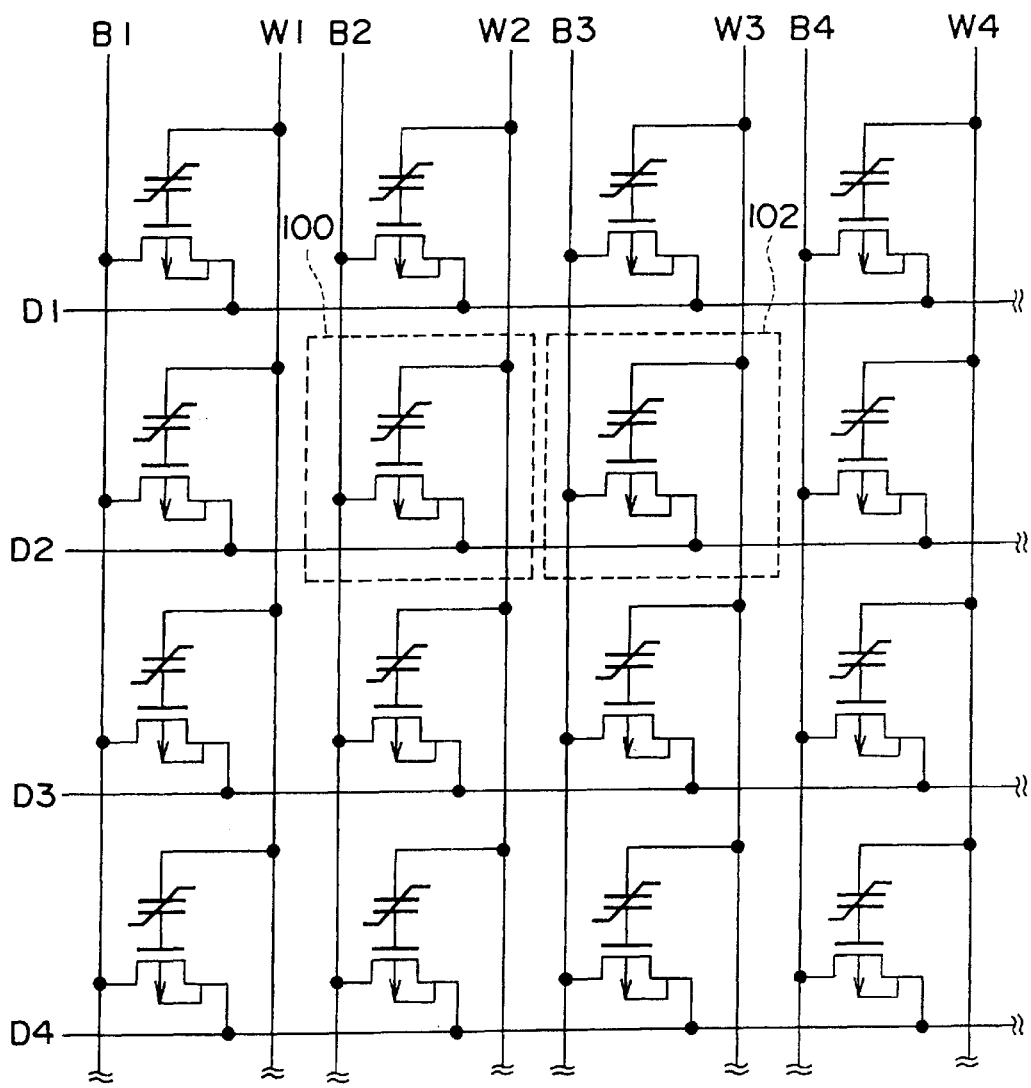
FIG. 4 is a view showing a structure of a conventional memory cell array.
Figure 5:
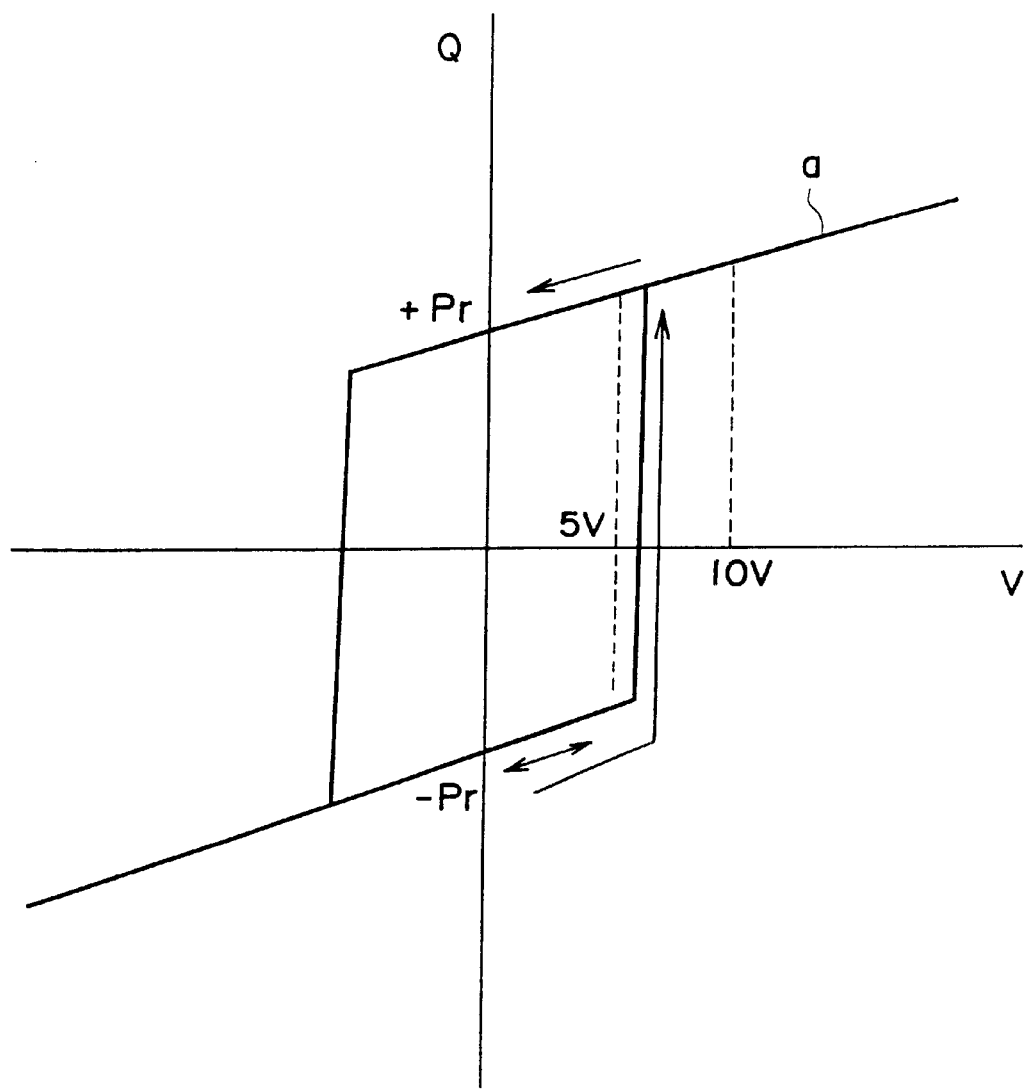
FIG. 5 is a view showing a hysteresis characteristic of a ferroelectric capacitor.

Next, a memory cell array using the memory cell of this embodiment is explained. FIG. 3 is a circuit diagram showing the structure of the memory cell array. The memory cell array is structured with a predetermined number of memory cells lined up horizontally and vertically. Each memory cell has the structure shown in FIG. 1, a structure wherein a selection transistor 12 is provided between a ferroelectric capacitor 10 and a control transistor 14.

Connection relationships between the respective terminals are now explained. Terminal a of a memory cell is connected to a line PLm (m is a row number). Each line PLm is connected to a memory cell power source 68. Terminal b of the memory cell is connected to a line Wn (n is a column number). Each line Wn is connected to a selection transistor driving section 70. Terminal c of the memory cell is connected to a line Bn. Each line Bn is connected to a sense amplifier 72. Terminal d of the memory cell is connected to a line Rm. Each line Rm is connected to a data readout driving section 74. Terminal e of the memory cell is connected to an earth terminal 76. The earth terminal 76 is kept at 0V during operation.

Next, operation of the memory cell array is explained, using the memory cell 78 in the memory cell array shown in FIG. 3 as an example. Terminals a, b, c and d of the memory cell 78 are respectively connected to lines PL2, W2, B2 and R2.

First, writing a datum to the memory cell 78 is explained. The selection transistor driving section 70 puts line W2 to a high level and all other lines Wn to a low level. Hence, all selection transistors connected to line W2 turn on.

The memory cell power source 68 applies a voltage, which is large enough to reverse the polarization of a ferroelectric capacitor 10, at line PL2. All other lines PLm are put to 0V. Because a selection transistor 12 of the memory cell 78 is turned on, the polarization of the ferroelectric capacitor 10 reverses, and data is written. At other memory cells connected to line PL2, selection transistors are off, ferroelectric capacitor polarizations are not reversed, and data is not destroyed.

At other memory cells connected to line W2, lines PLm are at 0V, which potential is the same as substrate potential. Therefore, recorded data is not destroyed.

Next, reading a datum from the memory cell 78 is explained. The selection transistor driving section 70 puts line W2 to a high level and all other lines Wn to a low level. Hence, all selection transistors connected to line W2 turn on.

The memory cell power source 68 puts all lines PLm to 0V. However, a voltage that is not large enough to reverse polarization of ferroelectric layers (e.g., 2V) may be applied to lines PLm, in order to improve sensitivity of the sense amplifier 72 (current ratio between a data 1 and a data 0).

The data readout driving section 74 puts line R2 to a high level. All other lines Rm are put into a floating state. Current flows at line B2 in accordance with the datum and the level of this current is detected by the sense amplifier 72. Hence, determination of the datum stored at the memory cell 78 (reading) is carried out.

Because very little voltage is applied to the ferroelectric capacitor, data destruction does not occur. Also, no voltage that is large enough to reverse polarization of a ferroelectric is applied to other memory cells. Therefore, data retained at each memory cell is not destroyed.

As is explained above in detail, in a semiconductor storage element formed in accordance with the present invention, a selection transistor is connected between one electrode of a ferroelectric capacitor and a control electrode of a control transistor. By setting a switching state of this selection transistor, polarization of the ferroelectric capacitor can be reversed, and thus data can be written at the semiconductor storage element. Therefore, in a memory cell array having a structure that uses the semiconductor storage element of the present invention, reversal of polarization of any ferroelectric capacitor outside the cell being written to is not performed, and destruction of stored data does not occur.

What is claimed is:

1. A memory cell comprising:
   a ferroelectric capacitor;
   a selection transistor;
   a control transistor;
   a sense amplifier coupled to a first main electrode of the control transistor; and
   a read line coupled to a second main electrode of the control transistor,
   wherein one electrode of said ferroelectric capacitor is connected with a first main electrode of said selection transistor, the other electrode of said ferroelectric capacitor is connected with a plate line which is different from the read line, and a second main electrode of said selection transistor is connected with a control electrode of said control transistor.

2. A memory cell comprising:
   a ferroelectric capacitor;
   a first transistor;
   a second transistor;
   a bit line coupled to a first main electrode of the second transistor; and
   a read line coupled to a second main electrode of the second transistor,
   wherein one electrode of two electrodes of said ferroelectric capacitor is connected with one main electrode of two main electrodes of said first transistor, the other electrode of said ferroelectric capacitor is connected with a plate line which is different from said read line and said bit line, and another main electrode of said first transistor is connected with a control electrode of said second transistor, said plate line having a voltage which varies.

3. A memory cell according to claim 2, wherein said first transistor is a field effect transistor, and the two main electrodes of said first transistor are a source electrode and a drain electrode.

4. A memory cell according to claim 2, wherein said second transistor is a field effect transistor, and the control electrode of said second transistor is a gate electrode.

5. A memory cell comprising:
   a ferroelectric capacitor structured to have a ferroelectric layer between an upper electrode and a lower electrode;
   a selection transistor having a first main electrode, a second main electrode and a control electrode;
   a control transistor having a first main electrode, a second main electrode and a control electrode; and
   first and second voltage lines coupled to the first and second main electrodes of said control transistor, respectively,
   wherein the lower electrode of said ferroelectric capacitor is connected with the first main electrode of said selection transistor, the upper electrode of said ferroelectric capacitor is connected with a plate line which is different from said first and second voltage lines and the second main electrode of said selection transistor is connected with the control electrode of said control transistor.

6. A memory cell array comprising a plurality of memory cells:
   (a) each memory cell including:
      a ferroelectric capacitor structured to have a ferroelectric layer between an upper electrode and a lower electrode;
      a selection transistor having a first main electrode , a second main electrode and a control electrode; and
      a control transistor having a first main electrode, a second main electrode, a control electrode and a back gate electrode;
      wherein the lower electrode of said ferroelectric capacitor is connected with the first main electrode of said selection transistor , and the second main electrode of said selection transistor is connected with the control electrode of said control transistor;
   (b) a power supply;
   (c) a selection transistor driving section;
   (d) a sense amplifier;
   (e) a data readout driving section; and
   (f) an earth terminal,
   wherein the upper electrode of said ferroelectric capacitor of each memory cell is connected with said power supply by a respective plate line, the control electrode of said selection transistor of each memory cell is connected with said selection transistor driving section by a respective common word line shared by plural memory cells, the first main electrode of said control transistor of each memory cell is connected with said sense amplifier by a respective common bit line shared by plural memory cells, the second main electrode of said control transistor of each memory cell is connected with said data readout driving section by a respective common read line shared by plural memory cells, and the back gate electrode of said control transistor of each memory cell is connected with said earth terminal.

7. A memory cell according to claim 1, wherein said plate line has a voltage which varies.

8. A memory cell according to claim 3, wherein said second transistor has its backgate electrode coupled to ground.

9. A memory cell according to claim 5, wherein said plate line has a voltage which varies.

10. A memory cell according to claim 6, wherein said respective plate line for each memory cell has a voltage which varies.

* * * * *